(12) United States Patent  
Chandrasekraran

(10) Patent No.: US 8,273,995 B2
(45) Date of Patent: Sep. 25, 2012

(54) CONCENTRIC VIAS IN ELECTRONIC SUBSTRATE

(75) Inventor: Arvind Chandrasekraran, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 902 days.

(21) Appl. No.: 12/163,028

(22) Filed: Jun. 27, 2008

(65) Prior Publication Data

US 2009/0321126 A1    Dec. 31, 2009

(51) Int. Cl.
*H05K 1/11* (2006.01)
(52) U.S. Cl. ........................................ 174/262; 361/792
(58) Field of Classification Search .......... 174/262–266; 361/792–795
See application file for complete search history.

(56) References Cited

U.S. PATENT DOCUMENTS

| | | | |
|---|---|---|---|
| 5,421,083 A | 6/1995 | Suppelsa et al. | |
| 5,541,567 A | 7/1996 | Fogel et al. | |
| 5,949,030 A * | 9/1999 | Fasano et al. | 174/262 |
| 6,479,764 B1 | 11/2002 | Frana et al. | |
| 7,081,650 B2 | 7/2006 | Palanduz et al. | |
| 7,091,424 B2 | 8/2006 | Oggioni et al. | |
| 7,605,075 B2 | 10/2009 | Okabe et al. | |
| 2005/0247482 A1 * | 11/2005 | Nakamura | 174/262 |
| 2006/0131611 A1 | 6/2006 | Kaluzni et al. | |
| 2007/0199736 A1 | 8/2007 | Wang | |
| 2008/0122031 A1 | 5/2008 | DeNatale et al. | |

FOREIGN PATENT DOCUMENTS

| | | |
|---|---|---|
| EP | 1176641 A2 | 1/2002 |
| EP | 1675447 A1 | 6/2006 |
| EP | 1713314 A1 | 10/2006 |
| EP | 1746652 A1 | 1/2007 |

OTHER PUBLICATIONS

International Search Report and the Written Opinion—PCT/US2009/048029 International Search Authority—European Patent Office—Sep. 24, 2009.

* cited by examiner

*Primary Examiner* — Jeremy Norris
(74) *Attorney, Agent, or Firm* — Michelle Gallardo; Nicholas J. Pauley; Jonathan T. Velasco

(57) ABSTRACT

A multiwall via structure in an electronic substrate having multiple conductive layers. The multiwall via structure includes an outer via coupled to a pair of the conductive layers, an inner via within the outer via and coupled to the same pair of conductive layers, and a dielectric layer between the inner and outer vias. In various embodiments, the pair of conductive layers can be inner conductive layers or outer conductive layers of the electronic substrate. In other embodiments, a method of preparing a multiwall via structure is provided.

12 Claims, 4 Drawing Sheets

CONCENTRIC VIAS IN ELECTRONIC SUBSTRATE

BACKGROUND

1. Field of Disclosure

This disclosure relates generally to multilayer electronic substrates, and in particular to electronic substrates having multiwall vias.

2. Background

Vias are plated holes that electrically couple conductive layers of a multilayer substrate, such as a multilayer printed circuit board substrate or a package substrate. Conventional vias have one signal path connecting different conductive layers. In a dense package design having many electrical signals, a number of connections between different conductive layers may be required, and the space occupied by vias and their associated capture pads can be enough to expand the overall size of the substrate. It would be desirable to increase electrical signal density without concomitantly increasing the space occupied by vias and their capture pads.

SUMMARY

In one aspect, a multiwall signal carrying via structure is provided in an electronic substrate having multiple conductive layers. The multiwall signal carrying via structure includes: a) an outer via for coupling to a pair of conductive layers of the substrate, the outer via creating a first signal path between the pair of conductive layers; b) an inner via located within the outer via, for coupling to the pair of conductive layers, the inner via creating a second signal path between the pair of conductive layers; and c) a dielectric layer between the inner via and the outer via.

In another aspect, an electronic substrate having multiple conductive layers is provided. The substrate includes a multiwall signal carrying via structure that has: a) an outer via coupled to a pair of conductive layers of the substrate, the outer via creating a first signal path; b) an inner via located within the outer via and coupled to the same pair of conductive layers, the inner via creating a second signal path; and c) a dielectric layer between the inner via and the outer via.

In a further aspect, a method of preparing a multiwall signal carrying via structure in a substrate is provided. The method includes: a) providing an electronic substrate with multiple conductive layers; b) forming a first via coupled to a pair of the conductive layers and creating a first signal path; c) depositing a first dielectric layer within the first via; and d) forming a second via within the first via and through the first dielectric layer, the second via being coupled to the same pair of conductive layers and creating a second signal path.

A multiwall signal carrying via structure can provide two or more signal paths that interconnect the same pair of conductive layers of an electronic substrate but occupy the space of a conventional one path via. Thus, the multiwall via structure provides for increased signal density. A multiwall via structure can also provide for signal routing over paths of similar lengths, such as with a differential pair of signals.

The foregoing has outlined rather broadly the features and technical advantages of the present disclosure in order that the detailed description that follows may be better understood. Additional features and advantages will be described hereinafter which form the subject of the claims. It should be appreciated by those skilled in the art that the conception and specific embodiments disclosed may be readily utilized as a basis for modifying or designing other structures for carrying out the same purposes of the present disclosure. It should also be realized by those skilled in the art that such equivalent constructions do not depart from the spirit and scope of the invention as set forth in the appended claims. The novel features which are believed to be characteristic of the disclosure, both as to its organization and method of operation, together with further objects and advantages will be better understood from the following description when considered in connection with the accompanying figures. It is to be expressly understood, however, that each of the figures is provided for the purpose of illustration and description only and is not intended as a definition of the limits of the present invention.

BRIEF DESCRIPTION OF THE DRAWINGS

For a more complete understanding of the present disclosure, reference is now made to the following descriptions taken in conjunction with the accompanying drawings.

DETAILED DESCRIPTION

Figure 1:
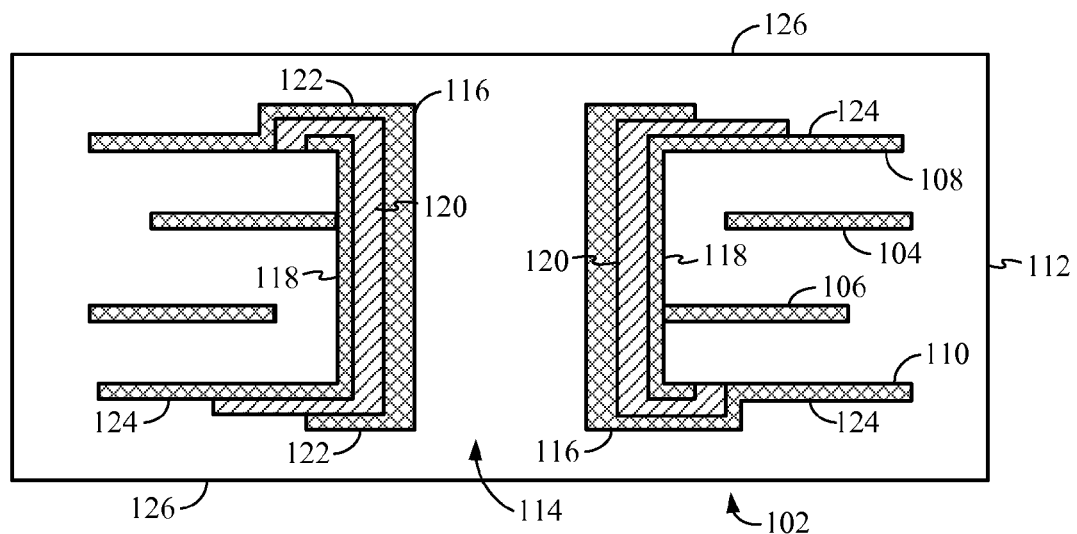
FIG. 1 is a sectional view of a multiwall via structure in an electronic substrate.

Referring to the embodiment shown in FIG. 1, an electronic package 102 having two inner conductive layers 104 and 106, and two outer conductive layers 108 and 110 is illustrated. Each conductive layer is separated from another by a dielectric material 112. The electronic substrate can be any multilayer substrate such as a buildup or laminate multilayer printed circuit board, or a buildup or laminate package substrate. A conventional multilayer substrate can be prepared by building up a two-sided core laminate with one or more layers of single-sided laminate added to each side of the core laminate. Examples of dielectric material used in laminates include, but are not limited to, FR-2 phenolic cotton paper, FR-4 woven glass and epoxy resin, G-10 woven glass and epoxy, CEM-1 cotton paper and epoxy, CEM-3 woven glass and epoxy, CEM-5 woven glass and polyester, polyimide, and other dielectric materials typically used in preparing multilayer substrates.

Figure 2:
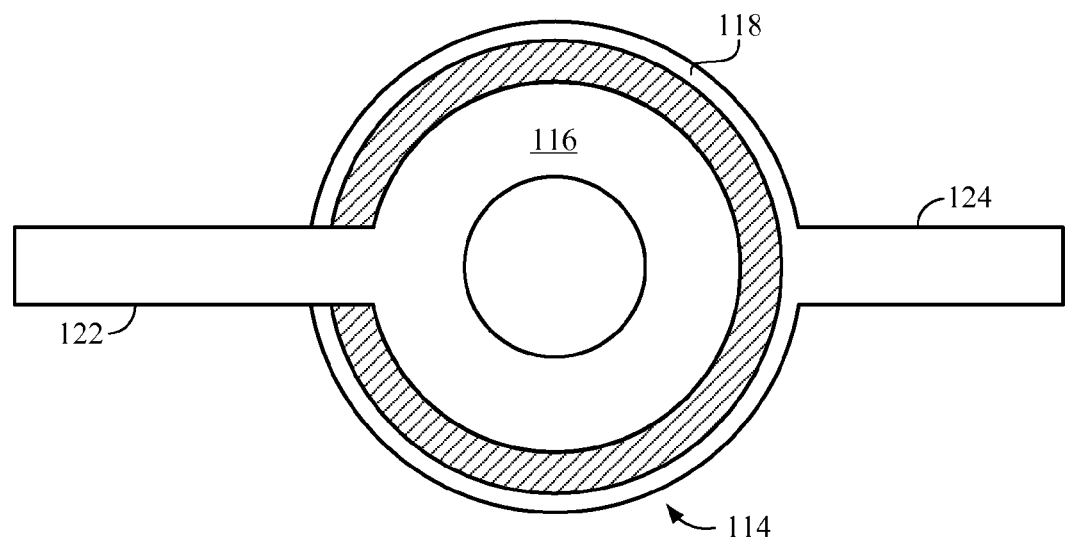
FIG. 2 is a top view of a multiwall via structure.

A multiwall via structure 114 is included in the embodiment shown in FIGS. 1 and 2. The multiwall via structure 114 comprises an inner via 116 within an outer via 118, and can be considered as a having a "via within a via" design. As used herein, the term "multiwall" refers to the "via within a via" design. The inner 116 and outer vias 118 can be described as "concentric" for convenience, with the understanding that "concentric" describes the via within a via design but not the actual alignment of the vias. Thus, the vias may, or may not, actually be concentric with each other. Both the inner 116 and outer vias 118 are coupled to the same pair of conductive layers, in this case the outer conductive layers 108,110. A layer 120 of dielectric material electrically insulates the inner via 116 from the outer via 118. Contacts 122,124 couple the inner via 116 and the outer via 118, respectively, to the outer conductive layers 108,110. In the embodiment, a solder mask 126 is present on both sides of the multilayer substrate.

Although in this embodiment, a substrate having four conductive layers is described, in other embodiments, substrates can have two, six, eight, ten, twelve, or more than twelve conductive layers. Thus, a wall of a multiwall via structure can connect pairs of conductive layers that are not separated by intervening conductive layers, or that are separated by more than two intervening conductive layers.

Although a substrate having a single multiwall via structure is described, other embodiments include substrates having more than one multiwall via structure.

Once a substrate with one or more multiwall via structures is prepared, the substrate can be incorporated into an assembly for use in an electronic device, such as a cell phone, computer, and the like.

One advantage of the multiwall via structure described herein is that it can be prepared using existing manufacturing processes.

A multiwall via structure can be prepared by a method that comprises: a) providing an electronic substrate comprising multiple conductive layers; b) forming a first via coupled to a pair of the conductive layers; c) filling the first via with a dielectric material; and d) forming a second via within the first via and through the dielectric material, with the second via coupled to the same pair of conductive layers. In the completed multiwall via structure, the first via is considered an outer via, while the second via is considered an inner via.

A via can be prepared by a method that comprises forming a through hole through a substrate, then plating the through hole with a conductive material. The through hole can be made by punching, drilling or lasing, depending on such considerations as the size of the hole and convenience. In some embodiments, via preparation includes cleaning the through hole before plating. The through hole can be plated, or metalized, by sputtering or electroplating. For example, electroless copper can be applied, followed by electrolytic copper. Other metals that can be applied during the plating process include, but are not limited to, nickel, gold, palladium, or silver. Alternatively, the through hole can be plated with a conducting polymer.

The dielectric material filling the first via, and separating the first from the second via, can be an epoxy resin. Other examples of dielectric material include, but are not limited to, polyphenylene (PPE), annylated polyphenylene ether (APPE), benzocyclobutene (BCB), cyanate (triazine) resins, polytetrafluorethylene (PTFE), bismaleimide triazine (BT) resins, polyimide, polyester, phenolic, and poly(phenyleneetherketone) (PEEK).

Figure 3:
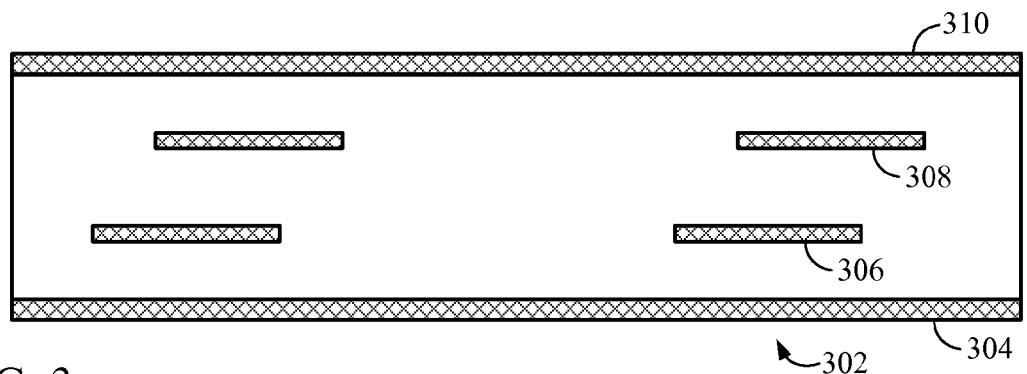
FIG. 3 is a sectional view of a multilayer electronic substrate.
Figure 4:
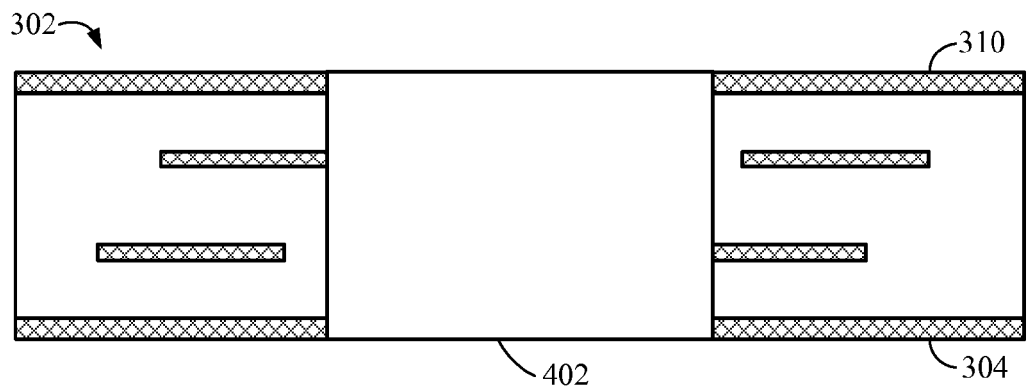
FIG. 4 is a sectional view of a through hole.
Figure 5:
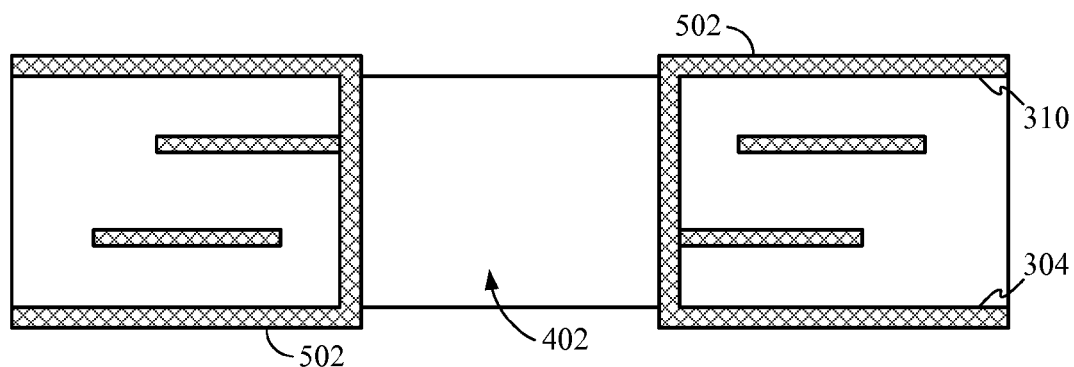
FIG. 5 is a sectional view of a plated through hole.
Figure 6:
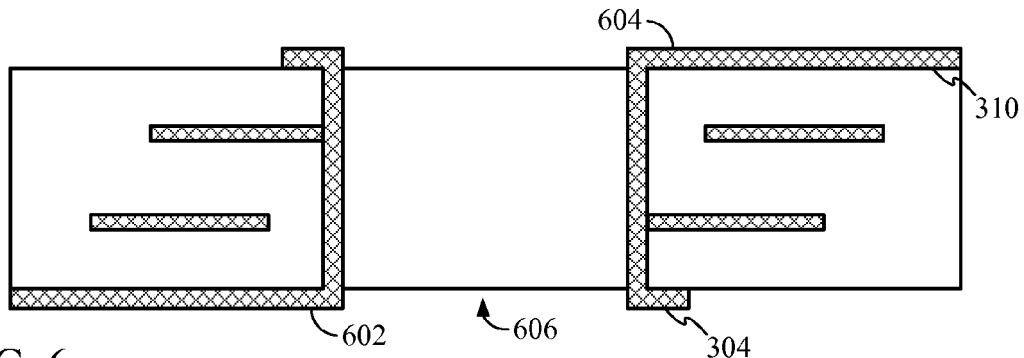
FIG. 6 is a sectional view of a via.

In a particular embodiment shown in FIGS. 3-10, construction of an exemplary multi walled via will now be described. In FIG. 3 an electronic substrate 302 comprising multiple conductive layers 304,306,308,310 is provided. In FIG. 4, a through hole 402 is formed through the substrate 302. In FIG. 5, a conductive material 502, such as copper, is plated in the through hole 402 and over a portion of the pair of conductive layers 304,310. The conductive material 502 plated over the pair of conductive layers 304,310 is masked or patterned to create contacts 602,604 for connecting the first formed via 606 to the pair of conductive layers 304,310, as shown in FIG. 6.

Figure 7:
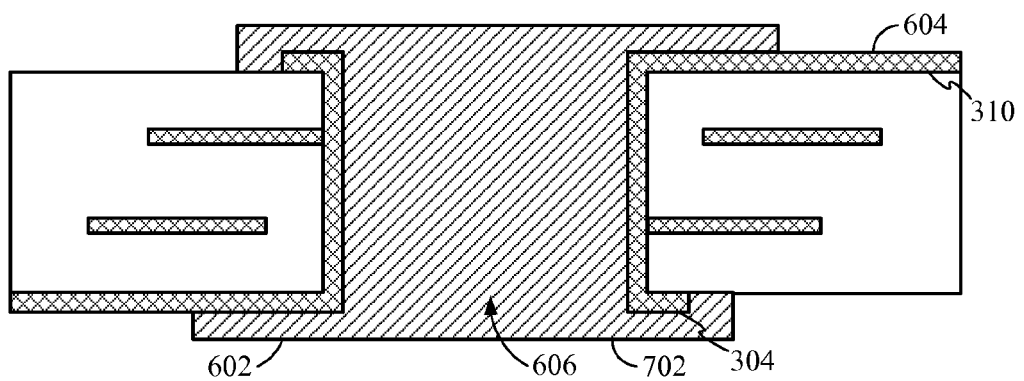
FIG. 7 is a sectional view of a via filled with a dielectric material.

As seen in FIG. 7, the first via 606 is then filled under pressure with a dielectric material 702, such as epoxy resin, with the dielectric material 702 being deposited over at least a portion of the contacts 602,604. The dielectric material 702 is planarized and patterned to remove excess dielectric material.

Figure 8:
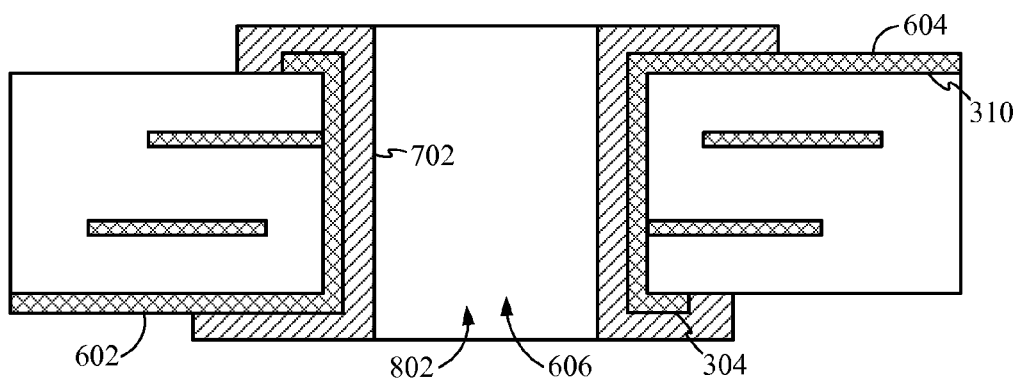
FIG. 8 is a sectional view of a through hole within a via.
Figure 9:
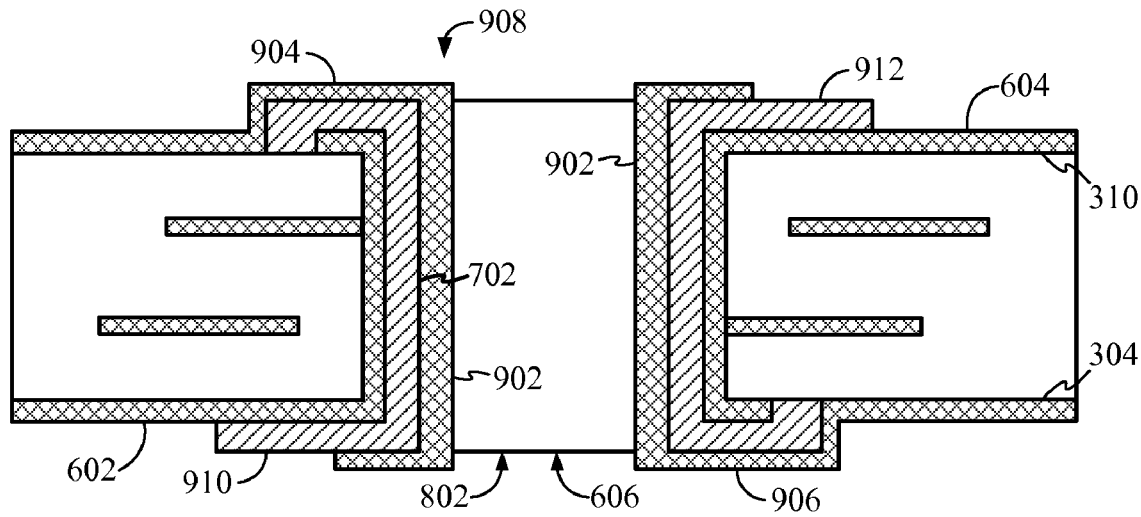
FIG. 9 is a sectional view of a plated through hole within a via.
Figure 10:
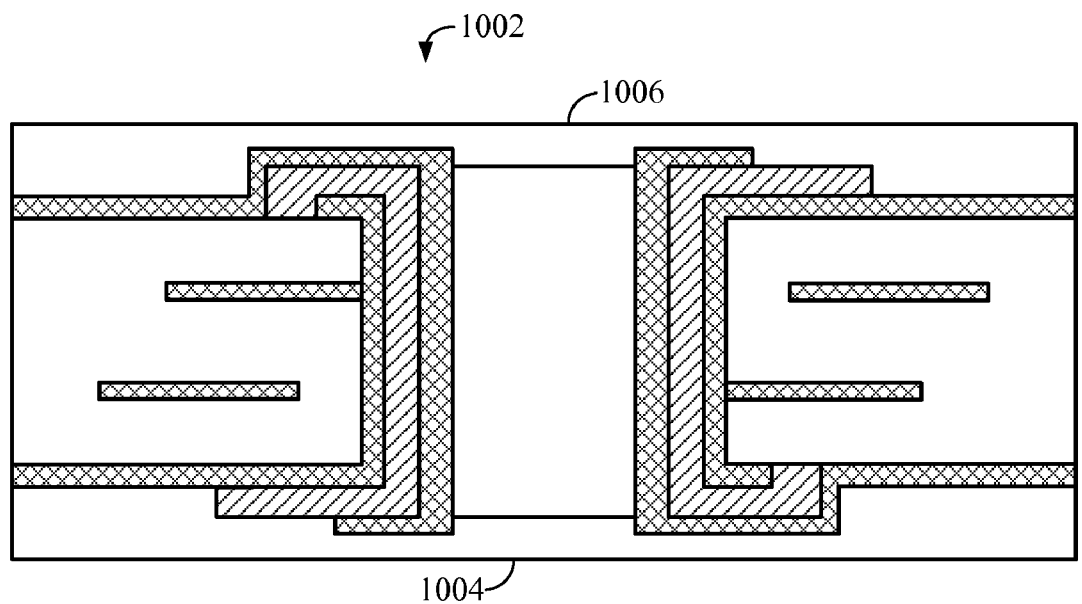
FIG. 10 is a sectional view of a solder mask over a via structure.

As seen in FIG. 8, an inner, second via is prepared by forming a through hole 802 through the dielectric material 702 and within the first via 606. FIG. 9 shows plating of a second conductive material 902 in the through hole 802 and over the patterned dielectric material 702. The plated conductive material 902 can be masked or patterned to create contacts 904,906 for connecting the formed second via 908 to the pair of conductive layers 304,310, as seen. In this embodiment, the dielectric material 702 forms insulating layers 910, 912 between the contacts 602,604 of the outer, first via 606 and the inner, second via 908. A multiwall via structure 1002 results from the embodiment shown in FIGS. 3-10. In some embodiments, a solder mask 1004,1006 can be applied over both surfaces of the via-containing substrate, as seen in FIG. 10.

Although a multiwall via structure having two vias is described, multiwall via structures having three or more concentric vias are also provided. For example, a third via can be added to the multiwall via structure 1002 by a method that comprises filling the inner, second via with a dielectric material, planarizing and patterning the dielectric material, forming a through hole through the dielectric material, plating a conductive material in the though hole, then masking or patterning the plated material, similar to the method shown in FIGS. 7-10. Additional vias can be included by repeatedly adding another via within the innermost via. In certain embodiments, multiwall via structures having three or more concentric vias are provided.

In another embodiment, the cavity of the innermost via can be filled with a dielectric material, a conductive material, or left unfilled.

In various embodiments, the conductive material of one via can be the same as or different from the conductive material of any other via of the via structure. In certain embodiments, the conductive material is copper in all vias of the multiwall via structure. Similarly, the dielectric material between two vias can be the same as or different from the dielectric material separating any other two vias of the multiwall via structure.

In other embodiments, a multiwall via structure can connect pairs of inner conductive layers. For example, in a four-layer substrate, the inner two conductive layers can be connected. This can be accomplished by forming a multiwall via structure in a core laminate having two conductive layers, then adding a layer of single-sided laminate to each side of the core. The result is a four-layer substrate with a multiwall via structure connecting the inner conductive layers. Similarly, a six-layer substrate with a multiwall via structure connecting the second and fifth conductive layers can be prepared by adding a layer of single-sided laminate to both sides of a four-layer laminate containing a multiwall via structure. In like fashion, multiwall via structures connecting inner conductive layers of substrates with more than six conductive layers can be prepared.

Each embodiment of the multiwall via structure provides at least two signal paths that interconnect the same pair of inner or outer conductive layers. Because the space occupied by the multiwall via structure is equivalent to the space occupied by a conventional one path via, the multiwall via structure provides increased signal density. Moreover, the multiwall via structure can be included in the circuitry of a differential pair of signals so that both members of the differential pair have similar path lengths. For example, using a conventional one path via, one member of the differential pair connects to a different via than the other member. Depending on the location of each via, this can mean that the differential pair have different overall path lengths. In contrast, by employing the multiwall via structure, the overall path lengths of the differential pair would be similar since each member of the differential pair connects to the same multiwall via structure.

As described herein, a multiwall signal carrying via structure provides two or more signal paths that interconnect a pair of conductive layers, thus increasing signal density.

Although the present invention and its advantages have been described in detail, it should be understood that various changes, substitutions and alterations can be made herein without departing from the spirit and scope of the invention as defined by the appended claims. Moreover, the scope of the present application is not intended to be limited to the particular embodiments of the process, machine, manufacture, composition of matter, means, methods and steps described in the specification. As one of ordinary skill in the art will readily appreciate from the disclosure, processes, machines, manufacture, compositions of matter, means, methods, or steps, presently existing or later to be developed that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A multiwall signal carrying via structure in an electronic substrate having multiple conductive layers, comprising:
    an outer via creating a first signal path between a pair of outer conductive layers of the electronic substrate;
    a pair of outer contacts coupling the pair of outer conductive layers of the electronic substrate to the outer via;
    an inner via within the outer via, the inner via creating a second signal path between the pair of outer conductive layers;
    a pair of inner contacts coupling the pair of outer conductive layers to the inner via; and
    a dielectric layer between the inner via and the outer via.

2. The multiwall signal carrying via structure of claim 1, further comprising a contact area which comprises the pair of outer contacts and the pair of inner contacts, the pair of outer contacts and the inner contacts separated by a patterned dielectric layer.

3. An electronic substrate having multiple conductive layers, said substrate comprising a multiwall signal carrying via structure comprising:
    an outer via creating a first signal path;
    a pair of outer contacts coupling a pair of outer conductive layers of the electronic substrate to the outer via;
    an inner via within the outer via, the inner via creating a second signal path;
    a pair of inner contacts coupling the pair of outer conductive layers to the inner via; and
    a dielectric layer between the inner via and the outer via.

4. The electronic substrate of claim 3, wherein the multiwall signal carrying via structure further comprises:
    at least one additional via disposed within the inner via and coupled to the pair of conductive layers, the at least one additional via creating another signal path; and
    a dielectric layer between the at least one additional via and the inner via.

5. The electronic substrate of claim 3, wherein the multiwall signal carrying via structure further comprises a contact area comprising the pair of outer contacts and the pair of inner contacts, the pair of outer contacts and the pair of inner contacts separated by a patterned dielectric layer.

6. The electronic substrate of claim 3, wherein the electronic substrate is a printed circuit board substrate.

7. The electronic substrate of claim 3, wherein the electronic substrate is a buildup or laminate substrate.

8. The electronic substrate of claim 3, wherein the multiwall signal carrying via structure is incorporated into signal paths of a differential pair of signals.

9. A method of manufacturing a multiwall signal carrying via structure in a substrate, comprising:
    providing an electronic substrate comprising multiple conductive layers;
    forming a first via to create a first signal path between a pair of outer conductive layers of the electronic substrate;
    forming a pair of outer contacts to couple the pair of outer conductive layers of the electronic substrate to the first via;
    depositing a first dielectric layer within the first via;
    patterning the first dielectric layer;
    forming a second via within the first via and through the first dielectric layer, the second via creating a second signal path between the pair of outer conductive layers; and
    forming a pair of inner contacts coupling the pair of outer conductive layers to the second via.

10. The method of claim 9, wherein the second via is formed by a process comprising:
    forming a through hole within the first via and through the first dielectric layer;
    plating a conductive material in the through hole and over a portion of each layer of the pair of conductive layers; and
    patterning the conductive material plated over the portion of each layer of the pair of conductive layers.

11. The method of claim 9, further comprising depositing a solder mask over each layer of the pair of conductive layers.

12. A multiwall signal carrying via structure in an electronic substrate having multiple conductive layers, comprising:
    first means for signaling between a pair of outer conductive layers of the electronic substrate;
    a pair of outer contacts coupling the pair of outer conductive layers of the electronic substrate to the first signaling means;
    second means for signaling between the pair of outer conductive layers, the second signaling means being within the first signaling means;
    a pair of inner contacts coupling the pair of outer conductive layers to the second signaling means; and
    an insulating means between the second signaling means and the first signaling means.

* * * * *